United States Patent
Kim et al.

(10) Patent No.: US 12,482,639 B2
(45) Date of Patent: Nov. 25, 2025

(54) METHOD AND SYSTEM FOR REMOVING L-FC IN PLASMA ETCHING PROCESS

(71) Applicant: DAEJEON UNIVERSITY INDUSTRY-UNIVERSITY COOPERATION FOUNDATION, Daejeon (KR)

(72) Inventors: Kyong Nam Kim, Suwon-si (KR); Jun Young Park, Goyang-si (KR); Seok Jun Kim, Daejeon (KR)

(73) Assignee: DAEJEON UNIVERSITY INDUSTRY-UNIVERSITY COOPERATION FOUNDATION, Daejeon (KR)

( * ) Notice: Subject to any disclaimer, the term of this patent is extended or adjusted under 35 U.S.C. 154(b) by 311 days.

(21) Appl. No.: 17/762,278

(22) PCT Filed: Sep. 9, 2020

(86) PCT No.: PCT/KR2020/012156
§ 371 (c)(1),
(2) Date: Mar. 21, 2022

(87) PCT Pub. No.: WO2021/054670
PCT Pub. Date: Mar. 25, 2021

(65) Prior Publication Data
US 2023/0022946 A1    Jan. 26, 2023

(30) Foreign Application Priority Data
Sep. 20, 2019    (KR) .................. 10-2019-0115965

(51) Int. Cl.
*H01J 37/32*    (2006.01)
*B08B 7/00*    (2006.01)
(Continued)

(52) U.S. Cl.
CPC ........ *H01J 37/32862* (2013.01); *B08B 7/005* (2013.01); *B08B 7/0057* (2013.01);
(Continued)

(58) Field of Classification Search
CPC ............. H01J 37/32862; H01J 37/3211; H01J 37/3488; H01J 37/32; H01J 37/32009;
(Continued)

(56) References Cited

U.S. PATENT DOCUMENTS 5,415,728 A * 5/1995 Hasegawa ......... H01L 21/67069
438/941
5,531,857 A * 7/1996 Engelsberg ........ B23K 26/1436
134/1
(Continued)

FOREIGN PATENT DOCUMENTS

JP    2004-091828 A    3/2004
KR    10-2000-0062733 A    10/2000
(Continued)

*Primary Examiner* — Erin F Bergner
(74) *Attorney, Agent, or Firm* — Bridgeway IP Law Group, PLLC; Jihun Kim

(57) ABSTRACT

Proposed are a method and a system for removing L-FC in a plasma etching process, in which L-FC, which is condensed on a wafer, an electrode, a substrate, a head, or the like, is removed by using infrared or ultraviolet rays in a plasma etching process using an L-FC precursor.

4 Claims, 5 Drawing Sheets

(51) Int. Cl.
  *H01J 37/34* (2006.01)
  *H01L 21/02* (2006.01)
  *H01L 21/311* (2006.01)

(52) U.S. Cl.
  CPC ....... *H01J 37/3211* (2013.01); *H01J 37/3488* (2013.01); *H01L 21/0206* (2013.01); *H01L 21/31116* (2013.01)

(58) Field of Classification Search
  CPC ... B08B 7/005; B08B 7/0057; H01L 21/0206; H01L 21/31116; H01L 21/02057; H01L 21/67; H01L 21/3065; H01L 21/67069; H05H 1/46
  See application file for complete search history.

(56) References Cited

U.S. PATENT DOCUMENTS

| | | | |
|---|---|---|---|
| 6,098,637 A * | 8/2000 | Parke | B08B 7/0057 118/724 |
| 6,235,214 B1 | 5/2001 | Deshmukh et al. | |
| 6,254,689 B1 * | 7/2001 | Meder | G03F 7/427 134/1 |
| 6,312,616 B1 | 11/2001 | Chinn et al. | |
| 6,583,063 B1 | 6/2003 | Khan et al. | |
| 2002/0052114 A1 * | 5/2002 | Marks | H01L 21/31138 438/689 |
| 2002/0189636 A1 * | 12/2002 | Sun | C23C 16/4405 134/1 |
| 2005/0164506 A1 * | 7/2005 | Chen | H01L 21/67069 257/E21.252 |
| 2008/0092806 A1 * | 4/2008 | West | C23C 16/4407 134/1 |
| 2009/0065027 A1 * | 3/2009 | Kawamura | H01L 21/02087 134/105 |

FOREIGN PATENT DOCUMENTS

| | | |
|---|---|---|
| KR | 10-0800396 B1 | 2/2008 |
| KR | 10-2008-0109033 A | 12/2008 |
| KR | 10-2010-0053485 A | 5/2010 |
| KR | 10-1792165 B1 | 10/2017 |

* cited by examiner

METHOD AND SYSTEM FOR REMOVING L-FC IN PLASMA ETCHING PROCESS

TECHNICAL FIELD

The present invention relates to a method and a system for removing L-FC in a plasma etching process, in which L-FC condensed on a wafer, an electrode, a substrate, a head, or the like is removed by using infrared or ultraviolet rays in a plasma etching process using an L-FC precursor.

BACKGROUND ART

In general, various gases are used as etching precursors for etching in semiconductor and display processes, and typically, a fluorocarbon-based (CF) gas is used in a plasma etching process for manufacturing a semiconductor.

These CF-based gases have a high Global Warming Point (GWP), which causes global warming and have a low boiling point to make recollection thereof difficult.

In order to solve this problem, L-FC (C5F8, C7F8, C7F14, C4F9I, CBr2F2, C6F12O, and the like) based gas can be used, and this L-FC gas is mainly used in the capacitively coupled plasma (CCP) system.

The capacitively coupled plasma system is a plasma system in which electrons are accelerated by an electric field generated between electrodes and energy is obtained from the accelerated electrons.

However, the L-FC-based gas is present in a liquid phase at room temperature, and thus the L-FC neutral species and reaction by-products generated in the semiconductor process using the capacitively coupled plasma system are adsorbed to a gas injection head, electrodes, a wafer, or a substrate of the plasma system, thereby reducing the reliability of the process.

In addition, the capacitively coupled plasma system has a narrow process window between the electrode and the substrate, and thus there are limitations in that it is difficult to apply other methods for removing adsorbed L-FC.

Therefore, in such a situation, in the case of a semiconductor device manufacturing process using L-FC, there is an urgent need to solve the L-FC condensing problem on a head, electrodes, a wafer, or the like during the process.

[Patent Literature] Korean Patent Publication No. 10-2000-0062733

SUMMARY OF INVENTION

Technical Problem

The present invention was conceived to solve the above problems of the related art, and an object of the present invention is to improve the reliability of semiconductor devices by removing L-FC that are condensed on a head, an electrode, a wafer, or the like in the semiconductor device manufacturing process using L-FC.

Solution to Problem

The method for removing L-FC in the plasma etching process of the present invention having the above configuration removes L-FC condensed inside a chamber by irradiating with infrared or ultraviolet rays the inside of the chamber that performs plasma etching.

In addition, the infrared rays have a wavelength of 780 nm or more.

In addition, the ultraviolet rays have a wavelength of 10 to 380 nm.

In addition, in order to irradiate the inside of the chamber with infrared or ultraviolet rays, a window port is formed on one side of the chamber, a light source that irradiates infrared or ultraviolet rays is installed outside the chamber, and the inside of the chamber is irradiated with infrared or ultraviolet rays generated from the light source through the window port.

In addition, equipment such as a head or an electrode installed inside the chamber or a wafer or a substrate for manufacturing a semiconductor is irradiated with the infrared or ultraviolet rays.

In addition, a system for removing L-FC in a plasma etching process includes: a chamber into which an L-FC-based gas is injected as a precursor; an electrode which is installed in the chamber and to which electric power for generating plasma is supplied; a window port formed on one side of the chamber; and a light source that irradiates the inside of the chamber with infrared or ultraviolet rays through the window port.

In addition, the light source is a light source that emits infrared rays having a wavelength of 780 nm or more.

In addition, the light source is a light source that emits ultraviolet rays having a wavelength of 10 to 380 nm.

In addition, equipment such as a head or an electrode installed inside the chamber or a wafer or a substrate for manufacturing a semiconductor is irradiated with the infrared or ultraviolet rays.

In addition, if the plasma etching system is an inductively coupled plasma (ICP) system, the light source is a light source that applies an infrared or ultraviolet lamp through an insulating material (quartz) on the lower side of an antenna coil provided in the ICP system.

Advantageous Effects of Invention

The method and system for removing L-FC in the plasma etching process of the present invention having the above configuration remove L-FC that is condensed on a head, an electrode, a wafer, or the like of the system using an infrared or ultraviolet lamp, thereby achieving the effect of improving the reliability of a device without affecting semiconductor device manufacturing process conditions.

DESCRIPTION OF BEST EMBODIMENTS

The most preferred embodiment according to the present invention is a method for removing L-FC in a plasma etching process, and the method includes a configuration of irradiating with infrared or ultraviolet rays the inside of a chamber in which plasma etching is performed to remove L-FC condensed in the chamber.

DESCRIPTION OF EMBODIMENTS

Hereinafter, configurations of a method a system for removing L-FC in a plasma etching process of the present invention are described with reference to the drawings.

Here, the accompanied drawings are provided as examples to sufficiently convey the spirit of the present invention to those skilled in the art. Accordingly, the present invention is not limited to the drawings presented below and may be embodied in other aspects.

In addition, unless defined otherwise, the terms used in the present specification have the meaning commonly understood by those of ordinary skill in the art to which the present invention pertains, and in the following description and accompanying drawings, detailed descriptions of well-known functions and configurations that may be unnecessarily obscure the gist of the present invention will be omitted.

The method for removing L-FC of the present invention is configured to remove L-FC condensed on a head, an electrode, a wafer, or a substrate installed in a chamber by irradiating with infrared or ultraviolet rays the inside of the chamber in which the plasma etching is performed.

Here, the infrared rays are infrared rays having a wavelength of about 780 nm or more, and as the ultraviolet rays, ultraviolet rays having a wavelength of about 10 to 380 nm are used.

For the irradiation with the infrared or ultraviolet rays, a window port is formed on one side of the chamber, a light source irradiating infrared or ultraviolet rays is installed outside the chamber, and infrared or ultraviolet rays generated from the light source are applied into the chamber through the window port.

In particular, equipment such as a head or an electrode installed inside the chamber or a wafer or a substrate for manufacturing a semiconductor are irradiated with infrared or ultraviolet rays to remove L-FC neutral species and reaction by-products condensed on the head, the electrode, the wafer, or the substrate.

The method for removing L-FC according to an embodiment of the present invention can remove L-FC neutral species and reaction by-products adsorbed to the head, the electrode, the substrate and the wafer without affecting semiconductor device manufacturing process condition.

Accordingly, it is possible exhibit the effect of improving the yield in the semiconductor manufacturing process and increasing the reliability of the manufactured device.

Figure 1:
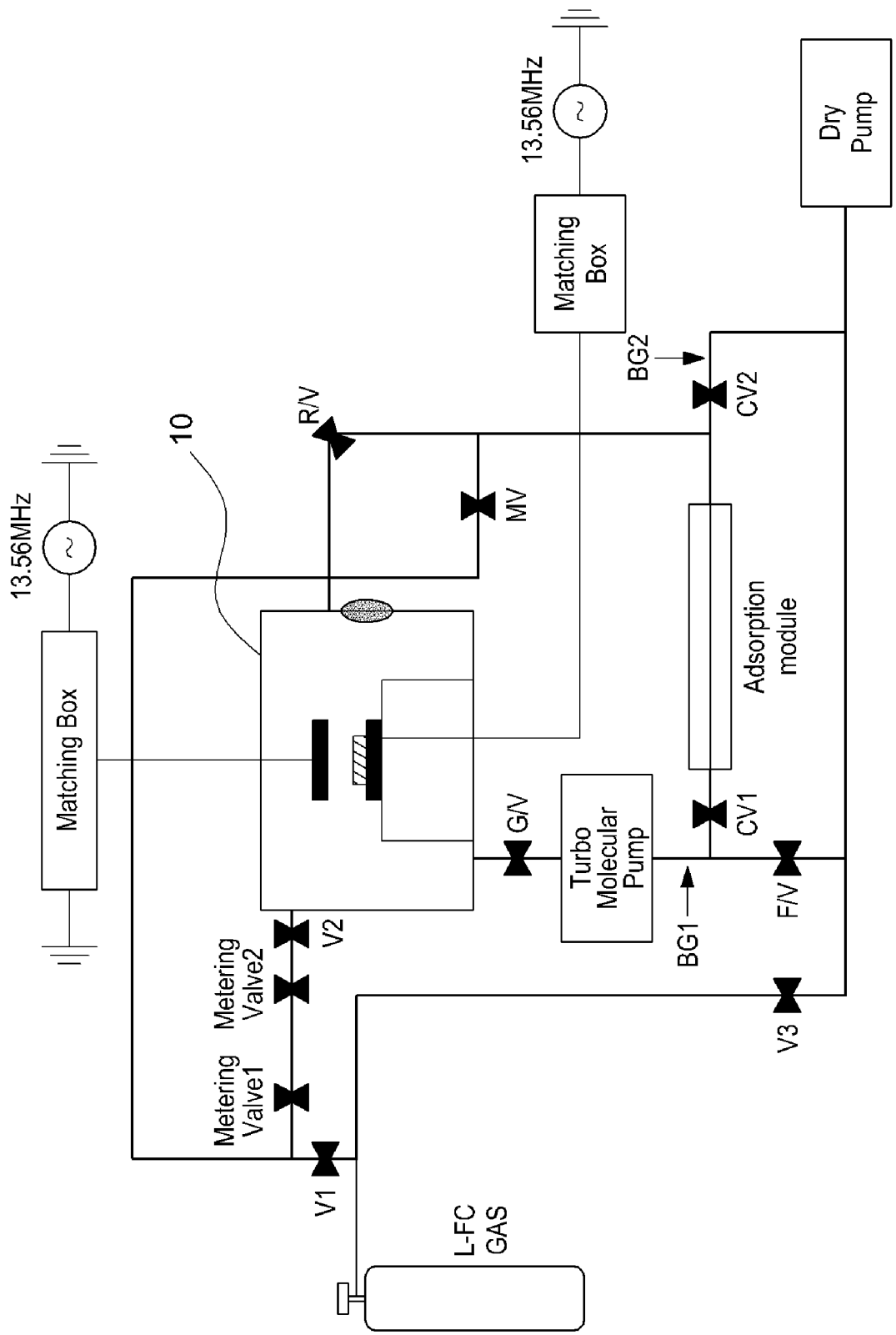
FIG. 1 is a diagram illustrating a configuration of a plasma etching system implementing a method for removing L-FC of the present invention.
Figure 2:
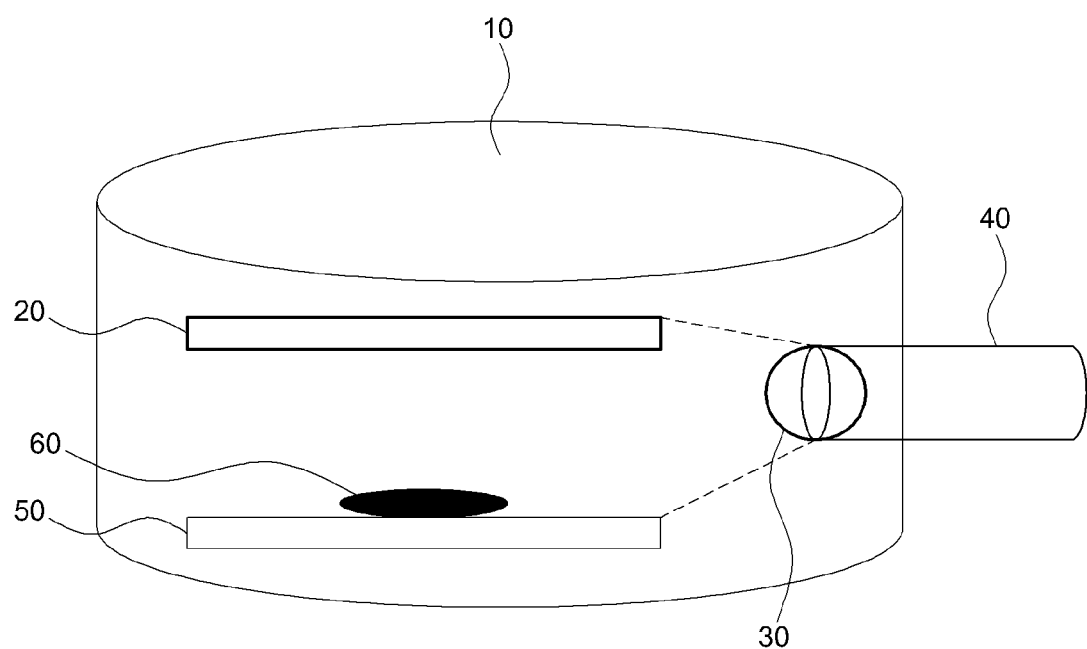
FIG. 2 is a detailed view of a chamber illustrated in FIG. 1.

Hereinafter, a system for implementing the method for removing L-FC of the present invention is described. FIG. 1 is a diagram illustrating a configuration of a plasma etching system implementing a method for removing L-FC of the present invention, and FIG. 2 is a detailed view of a chamber illustrated in FIG. 1.

Specifically, the plasma etching system of the present invention is configured to include: a chamber 10 into which L-FC ($C_5F_8$, $C_7F_8$, $C_7F_{14}$, $C_4F_9I$, $CBr_2F_2$, and $C_6F_{12}O$) based gas is injected as a precursor; an electrode 20 which is installed in the chamber 10 and to which electric power for generating plasma is supplied; a window port 30 formed on one side of the chamber 10; and a light source 40 that irradiates the inside of the chamber 10 with infrared or ultraviolet rays through the window port 30.

The gas injected into the chamber 10 may become a plasma state by electric power supplied to the electrode 20 and etches a wafer 60 formed on the substrate 50 in the plasma etching system.

The light source 40 may be a light source that emits infrared rays having a wavelength of 780 nm or more. In addition, the light source 40 may be light source that emits ultraviolet rays having a wavelength of 10 to 380 nm.

An operation of the plasma etching system of the present invention having the above configuration is described as follows.

First of all, the wafer 60 to be used for manufacturing a semiconductor is introduced into the chamber 10, and the L-FC gas is injected into the chamber 10 under constant pressure and temperature conditions.

Then, power is applied to the electrode 20 installed in the chamber 10. The L-FC gas injected into the chamber 10 causes a plasma reaction according to the electric power applied to the electrode 20 to etch the wafer 60.

At this point, the light source 40 installed outside the chamber 10 is turned on, equipment such as a head or an electrode installed inside the chamber or a wafer or a substrate for manufacturing a semiconductor is irradiated with infrared or ultraviolet rays generated from the operated light source 40 through the window port 30 formed on one side of the chamber 10, and L-FC neutral species and reaction by-products condensed on the head, the electrode, the wafer or the substrate are removed by the irradiated infrared or ultraviolet rays.

The plasma etching system in which L-FC removal is performed according to the embodiment of the present invention can remove L-FC neutral species and reaction by-products adsorbed to the head, the electrode, the substrate, and the wafer without affecting the semiconductor device manufacturing process conditions.

Figure 3:
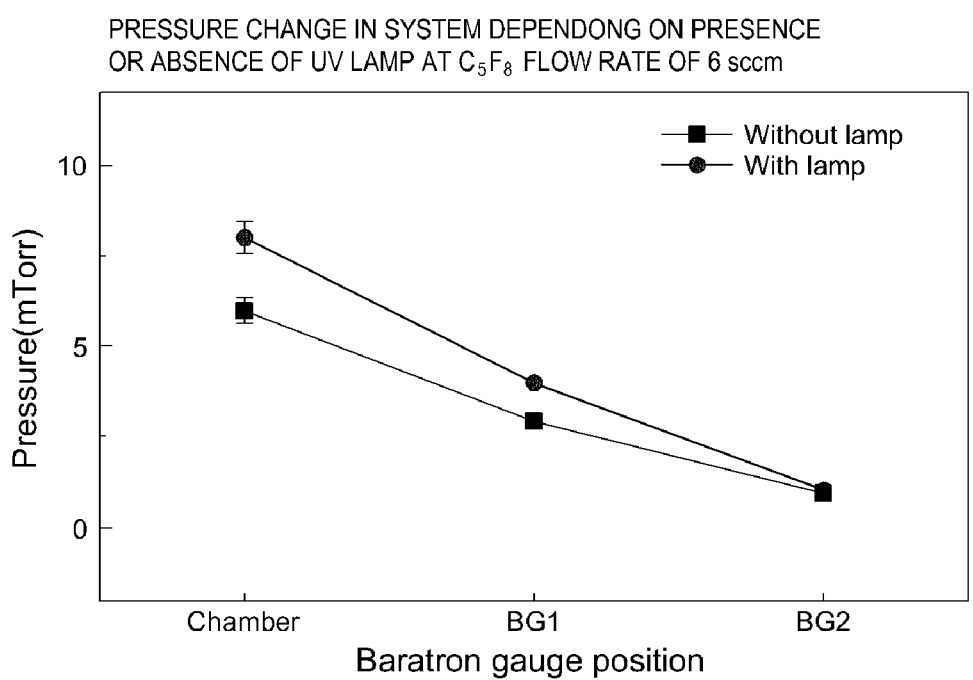
FIG. 3 is a graph of amounts of pressure changes in the chamber in which the method for removing L-FC of the present invention is performed.

FIG. 3 is a graph of amounts of pressure changes in the chamber in which the method for removing L-FC according to the embodiment of the present invention is performed, and is a graph illustrating a comparison between the case where the inside of the chamber 10 to which the $C_5F_8$ gas is supplied as a precursor is irradiated with the ultraviolet light source 40 and the case where the ultraviolet ray is not irradiated.

According to the graph, it can be seen that the pressure inside the chamber in the case where the inside of the chamber 10 is irradiated with ultraviolet rays is about 1.5 Torr higher than the pressure inside the chamber 10 in the case where the inside of the chamber 10 is not irradiated with ultraviolet rays. This is because, the L-FC gas neutral species and reaction by-products are removed due to the ultraviolet rays irradiated to the inside of the chamber 10 so that the L-FC is not condensed and is continuously present in a gaseous state.

Therefore, the plasma etching system of the present invention which is operated as described above can remove L-FC gas neutral species and reaction by-products adsorbed to the head, the electrode, the substrates, and the wafer without affecting the semiconductor device manufacturing process conditions.

Figure 4:
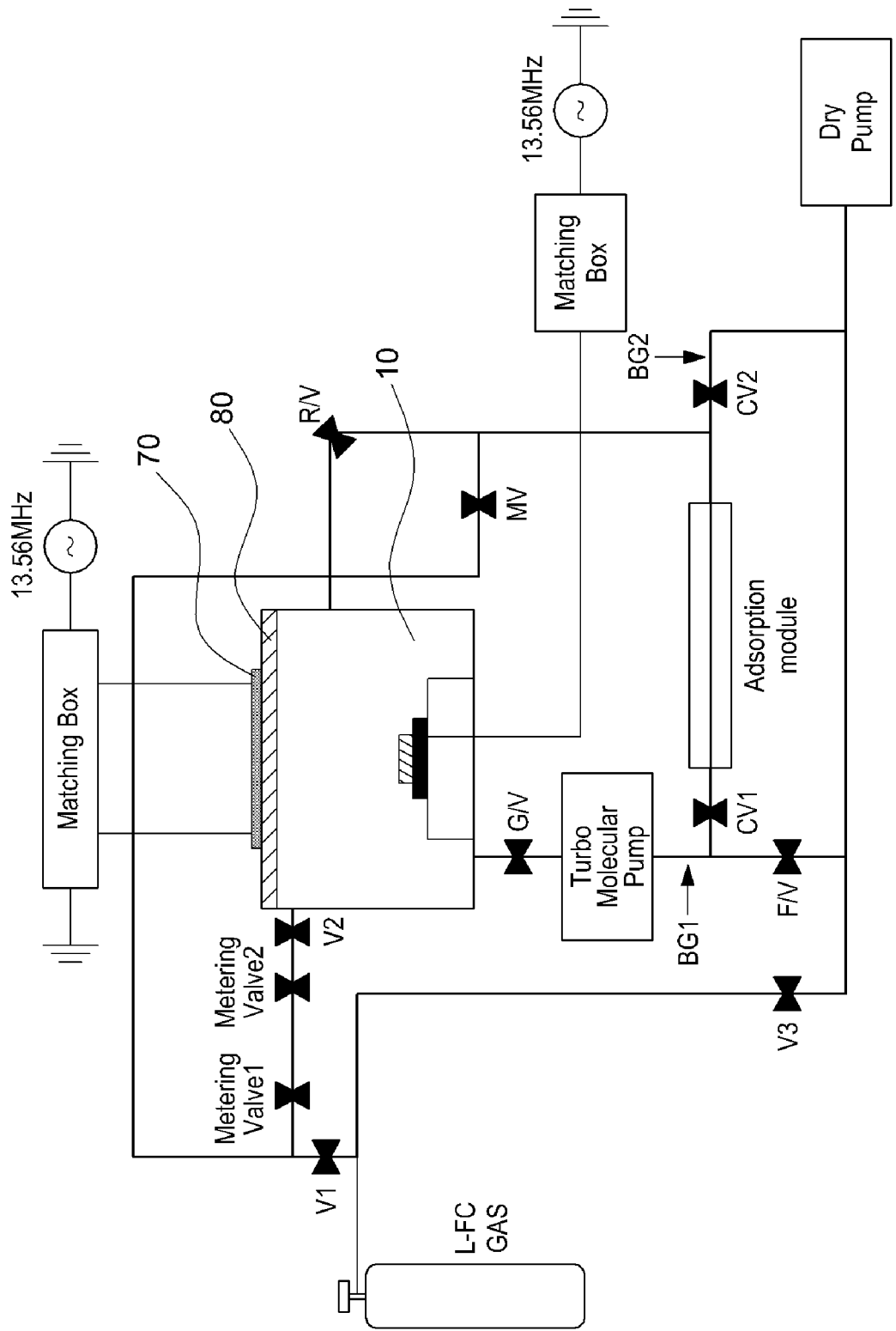
FIG. 4 is a diagram illustrating a configuration of a plasma etching system implementing method for removing L-FC according to another embodiment of the present invention.
Figure 5:
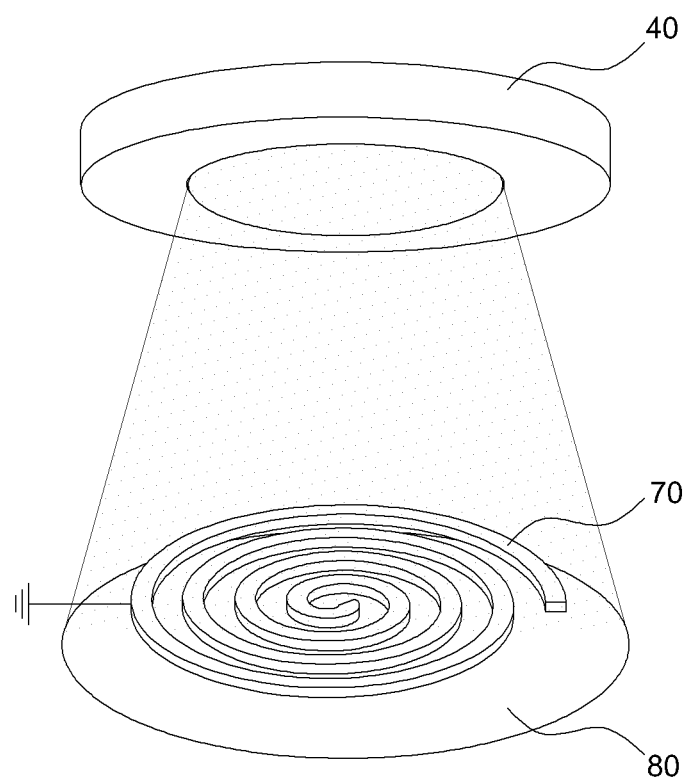
FIG. 5 is a detailed view of a chamber illustrated in FIG. 4.

In addition, FIG. 4 is a diagram illustrating a configuration of a plasma etching system implementing the method for removing L-FC according to another embodiment of the present invention, and FIG. 5 is a detailed view of the chamber illustrated in FIG. 4. Here, the same parts as described in FIGS. 1 and 2 are described using the same reference numerals.

Referring to FIGS. 4 and 5, the method for removing L-FC of the present invention is applicable to not only a capacitively coupled plasma (CCP) system but also an inductively coupled plasma (ICP) system.

That is, the light source 40 for irradiating an infrared or ultraviolet lamp through an insulating material 80 (quartz) on the lower side of an antenna coil 70 provided in the chamber 10 of the ICP system illustrated in FIGS. 4 and 5 is installed, and L-FC gas neutral species and reaction by-products are removed by infrared or ultraviolet rays irradiated from the light source 40.

REFERENCE SIGNS LIST

10; chamber
20; electrode
30; window port
40; light source
50; substrate
60; wafer
70; antenna coil
80; insulating material

The invention claimed is:

1. A method for removing L-FC in a plasma etching process, comprising:
    forming a window port on one side of a chamber;
    installing a light source that irradiates infrared or ultraviolet rays outside the chamber;
    injecting L-FC gas into the chamber;
    applying power to an electrode installed in the chamber to perform a plasma reaction of the L-FC gas to etch a wafer;
    while the L-FC gas is being injected and the power is being applied to the electrode to perform the plasma reaction to etch the wafer, irradiating an inside of the chamber with the infrared or ultraviolet rays generated from the light source through the window port in order to irradiate the inside of the chamber, such that the L-FC gas is not condensed and continuously remains in a gaseous state; and
    removing the L-FC gas from the inside of the chamber,
    wherein a substrate is formed at a bottom of the inside of the chamber and the electrode is formed at a top of the inside of the chamber, the electrode facing the substrate,
    wherein the irradiating of the inside of the chamber includes irradiating the electrode, the substrate, and the wafer at a same time by a single light irradiation.

2. The method for removing L-FC in a plasma etching process according to claim 1,
    wherein the infrared rays have a wavelength of 780 nm or more.

3. The method for removing L-FC in a plasma etching process according to claim 1,
    wherein the ultraviolet rays have a wavelength of 10 to 380 nm.

4. The method for removing L-FC in a plasma etching process according to claim 1,
    wherein equipment including a head installed inside the chamber irradiated with the infrared or ultraviolet rays.

* * * * *